US011522147B2

(12) United States Patent
Wang

(10) Patent No.: US 11,522,147 B2
(45) Date of Patent: Dec. 6, 2022

(54) ORGANIC LIGHT-EMITTING DEVICE AND DISPLAY DEVICE

(71) Applicant: Wuhan China Star Optoelectronics Semiconductor Display Technology Co., Ltd., Hubei (CN)

(72) Inventor: Fang Wang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 105 days.

(21) Appl. No.: 16/973,914

(22) PCT Filed: Jun. 19, 2020

(86) PCT No.: PCT/CN2020/097161
§ 371 (c)(1),
(2) Date: Dec. 10, 2020

(87) PCT Pub. No.: WO2021/248549
PCT Pub. Date: Dec. 16, 2021

(65) Prior Publication Data
US 2022/0190275 A1   Jun. 16, 2022

(30) Foreign Application Priority Data
Jun. 11, 2020 (CN) .......................... 202010530876.2

(51) Int. Cl.
*H01L 51/00* (2006.01)
*H01L 51/50* (2006.01)
(52) U.S. Cl.
CPC ...... *H01L 51/5012* (2013.01); *H01L 51/5036* (2013.01); *H01L 2251/558* (2013.01)

(58) Field of Classification Search
CPC ............. H01L 51/5012; H01L 51/5036; H01L 2251/558
See application file for complete search history.

(56) References Cited

U.S. PATENT DOCUMENTS

| | | | |
|---|---|---|---|
| 2016/0020406 | A1 | 1/2016 | Pu et al. |
| 2016/0181558 | A1 | 6/2016 | Rand et al. |
| 2016/0248033 | A1* | 8/2016 | Uesaka ................. H01L 51/504 |
| 2017/0179418 | A1 | 6/2017 | Lee |
| 2019/0173036 | A1 | 6/2019 | Hu et al. |

FOREIGN PATENT DOCUMENTS

| | | |
|---|---|---|
| CN | 104170110 | 11/2014 |
| CN | 106898630 | 6/2017 |
| CN | 107154463 | 9/2017 |
| CN | 108963099 | 12/2018 |
| CN | 109378392 | 2/2019 |
| CN | 110854279 | 2/2020 |
| CN | 111018863 | 4/2020 |

\* cited by examiner

*Primary Examiner* — Victor A Mandala
*Assistant Examiner* — Colleen E Snow
(74) *Attorney, Agent, or Firm* — PV IP PC; Wei Te Chung; Ude Lu

(57) ABSTRACT

The present application discloses an organic light-emitting device and a display device, which include a light-emitting layer. The light-emitting layer includes a donor light-emitting layer and an acceptor light-emitting layer, wherein at least one film layer of the donor light-emitting layer and the acceptor light-emitting layer adopts a thermally activated delayed material.

16 Claims, 2 Drawing Sheets

US 11,522,147 B2

ORGANIC LIGHT-EMITTING DEVICE AND DISPLAY DEVICE

RELATED APPLICATIONS

This application is a National Phase of PCT Patent Application No. PCT/CN2020/097161 having International filing date of Jun. 19, 2020, which claims the benefit of priority of Chinese Patent Application No. 202010530876.2 filed on Jun. 11, 2020. The contents of the above applications are all incorporated by reference as if fully set forth herein in their entirety.

FIELD AND BACKGROUND OF THE INVENTION

The present application relates to display panel technologies, and more particularly to an organic light-emitting device and a display device.

Organic light emitting diodes (OLEDs) have been favored by the market in recent years because they can be fabricated on flexible substrates. With the advent of foldable phones, the development of OLED can be said to have entered a second explosive stage in terms of small and medium sizes. However, in the most commonly used side-by-side system in current mobile phone display panels, a traditional blue fluorescent structure is still adopted for blue sub-pixels. The fluorescent material can only use 25% of singlet excitons such that the theoretical internal quantum efficiency is only 25%. Because only 25% of singlet excitons can be used, low efficiency and high power consumption of blue-ray devices have always been bottlenecks and obstruct the development of OLED displays.

A thermally activated delayed fluorescence (TADF) material is a new type of pure organic electronic material, which can simultaneously use singlet and triplet excitons generated by electrical excitation to achieve a theoretical internal quantum efficiency of 100%. An exciplex usually contain donor molecules and acceptor molecules. However, due to carrier imbalance propagated in the device, usually, a part of holes will get into the acceptor's highest occupied molecular orbit and a part of electrons will get into the donor's lowest unoccupied molecular orbit such that the carriers make self consistency in a monomer without forming the exciplex, thereby reducing the efficiency and stability of the devices.

Therefore, actually, there is a need to develop a new type of organic light-emitting device to overcome the drawbacks of existing arts.

SUMMARY OF THE INVENTION

The objective of the present invention is to provide an organic light-emitting device, which is capable of solving the problem of low efficiency and stability of organic light-emitting devices, caused by carrier imbalance propagated in the organic light-emitting devices in the existing arts.

To achieve above objective, the present invention provides an organic light-emitting device, including a light-emitting layer, which includes a donor light-emitting layer and an acceptor light-emitting layer, wherein at least one film layer of the donor light-emitting layer and the acceptor light-emitting layer adopts a thermally activated delayed material.

The light-emitting layer having the thermally activated delayed material may be self-luminous, and may serve as a host material doped with a guest material that emits light.

Further, in other embodiments, a thickness of the donor light-emitting layer ranges from 10 to 30 nm, a thickness of the acceptor light-emitting layer ranges from 10 to 20 nm, and the thickness of the donor light-emitting layer is greater than or equal to the thickness of the acceptor light-emitting layer. Arranging the thickness of the donor light-emitting layer 510 to be greater than or equal to the thickness of the acceptor light-emitting layer 520 can enlarge an exciton recombination area and maintain a balance between electrons and holes in the device.

Further, in other embodiments, in a case that both the donor light-emitting layer and the acceptor light-emitting layer adopt the thermally activated delayed material, a ratio of the thermally activated delayed material adopted by the donor light-emitting layer to the thermally activated delayed material adopted by the acceptor light-emitting layer ranges from 1.3:1 to 1:1.3.

In other embodiments, the donor light-emitting layer and the acceptor light-emitting layer may also be doped with a fluorescent material, and the fluorescent material may range from 1% to 10%.

Further, in other embodiments, the organic light-emitting device further includes a first exciton limiting layer, disposed at a side of the donor light-emitting layer away from the acceptor light-emitting layer; and a second exciton limiting layer, disposed at a side of the acceptor light-emitting layer away from the donor light-emitting layer.

Further, in other embodiments, the light-emitting layer includes a red light-emitting unit, a green light-emitting unit and a blue light-emitting unit, a triplet excitation energy level of both the first exciton limiting layer and the second exciton limiting layer on the red light-emitting unit is greater than or equal to 2.45 eV, a triplet excitation energy level of both the first exciton limiting layer and the second exciton limiting layer on the green light-emitting unit is greater than or equal to 2.60 eV, and a triplet excitation energy level of both the first exciton limiting layer and the second exciton limiting layer on the blue light-emitting unit is greater than or equal to 2.80 eV.

Further, in other embodiments, the organic light-emitting device further includes a hole transmission layer, disposed at a side of the light-emitting layer away from the first exciton limiting layer; a hole injection layer, disposed at a side of the hole transmission layer away from the light-emitting layer; an electron transmission layer, disposed at a side of the second exciton limiting layer away from the light-emitting layer; and an electron injection layer, disposed at a side of the electron transmission layer away from the light-emitting layer.

Further, in other embodiments, in a case that the donor light-emitting layer adopts the thermally activated delayed material and the acceptor light-emitting layer adopts no thermally activated delayed material, the acceptor light-emitting layer adopts a hole blocking material, the organic light-emitting device further includes an electron blocking layer, and the electron blocking layer is disposed between the hole transmission layer and the first exciton limiting layer.

Further, in other embodiments, a thickness of the electron blocking layer on the red light-emitting unit is greater than a thickness of the electron blocking layer on the green light-emitting unit, and a thickness of the electron blocking layer on the green light-emitting unit is greater than a thickness of the electron blocking layer on the blue light-emitting unit.

Further, in other embodiments, in a case that the acceptor light-emitting layer adopts the thermally activated delayed material and the donor light-emitting layer adopts no thermally activated delayed material, the donor light-emitting layer adopts an electron blocking material, the organic light-emitting device further includes a hole blocking layer, and the hole blocking layer is disposed between the electron transmission layer and the second exciton limiting layer.

Further, in other embodiments, in a case that both the acceptor light-emitting layer and the donor light-emitting layer adopt the thermally activated delayed material, the organic light-emitting device further includes an electron blocking layer disposed between the hole transmission layer and the first exciton limiting layer; and a hole blocking layer, disposed between the electron transmission layer and the second exciton limiting layer.

To achieve above objective, the present invention further provides a display device, which includes the organic light-emitting device involved in the present invention.

Compared to the existing arts, the beneficial effects of the present invention are described as follows. The present invention provides an organic light-emitting device and a display device, in which a donor-acceptor (D-A) structure material is chosen as the light-emitting layer, which is arranged to include the donor light-emitting layer and the acceptor light-emitting layer, at least one film layer of which adopts the thermally activated delayed material. By making use of a reverse intersystem-crossing (RISC) process of the thermally activated delayed material, making the most of injected carriers and enhancing utilization of excitons, it therefore prevents device aging and deterioration caused by excessive single-type carriers and excessive concentration of the excitons.

Further, disposing the exciton limiting layers at both sides of the light-emitting layer can prevent the energy from diffusing from the light-emitting layer to adjacent layers to cause energy loss, thereby ensuring full utilization of the energy.

BRIEF DESCRIPTION OF THE SEVERAL VIEWS OF THE DRAWINGS

The technical solutions and other beneficial effects of the present application will be more apparent with reference to the detailed descriptions of the embodiments of the present application below in accompanying with the drawings.

Figure 1:
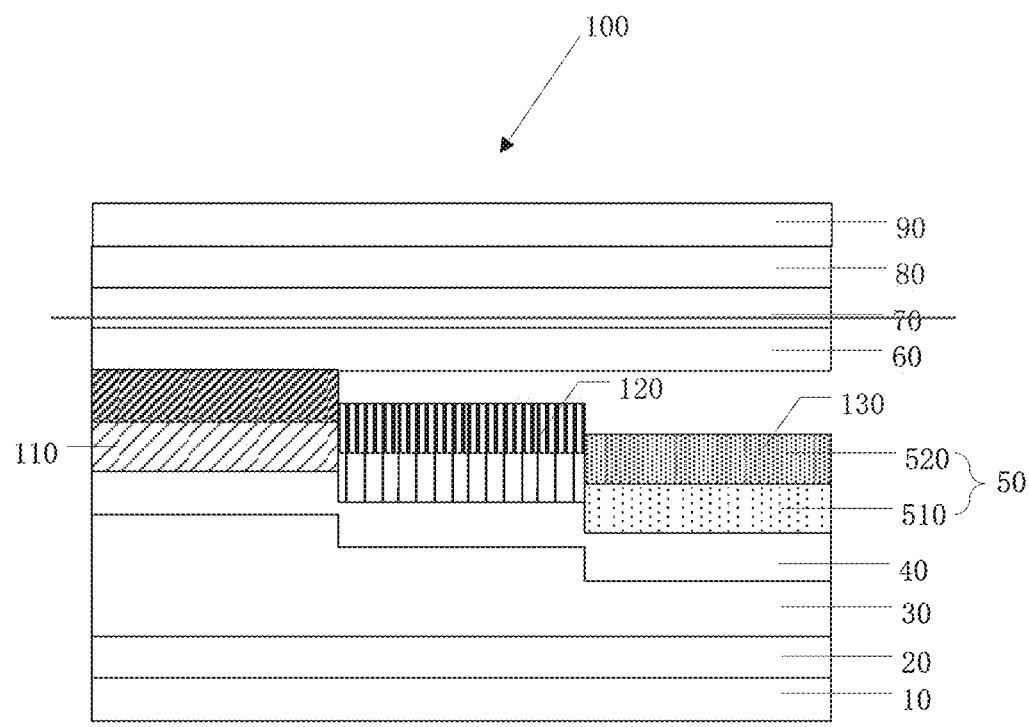
FIG. 1 is a structural schematic diagram showing an organic light-emitting device provided in Embodiment 1 of the present invention.

DESCRIPTION organic light-emitting device 100;
hole injection layer 10; hole transmission layer 20;
electron blocking layer 30; first exciton limiting layer 40;
light-emitting layer 50;
donor light-emitting layer 510; acceptor light-emitting layer 520;
second exciton limiting layer 60;
hole blocking layer 70; electron transmission layer 80;
electron injection layer 90;
red light-emitting unit 110; green light-emitting unit 120;
blue light-emitting unit 130.

DESCRIPTION OF SPECIFIC EMBODIMENTS OF THE INVENTION

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides a plurality of different embodiments or examples to implement different structures of this application. To simplify the disclosure of this application, the following describes components and settings in particular examples. Certainly, the examples are merely for illustrative purposes, and are not intended to limit this application. In addition, in this application, reference numerals and/or reference letters may be repeated in different examples. This repetition is for the purpose of simplicity and clarity, and does not in itself indicate a relationship between the various embodiments and/or settings that are discussed. In addition, this application provides examples of various particular processes and materials, but a person of ordinary skill in the art will recognize that other processes and/or materials may be applied and/or used.

Embodiment 1

An organic light-emitting device is provided in Embodiment 1. FIG. 1 is a structural schematic diagram showing an organic light-emitting device 100 provided in the present embodiment of the present invention. The organic light-emitting device 100 includes a hole injection layer 10, a hole transmission layer 20, an electron blocking layer 30, a first exciton limiting layer 40, a light-emitting layer 50, a second exciton limiting layer 60, an electron transmission layer 80 and an electron injection layer 90.

The hole transmission layer 20 is disposed on the hole injection layer 10. The electron blocking layer 30 is disposed on the hole transmission layer 20. The first exciton limiting layer 40 is disposed on the electron blocking layer 30. The light-emitting layer 50 is disposed on the first exciton limiting layer 40. The second exciton limiting layer 60 is disposed on the light-emitting layer 50. The electron transmission layer 80 is disposed on the second exciton limiting layer 60. The electron injection layer 90 is disposed on the electron transmission layer 80.

A donor-acceptor (D-A) structure material is chosen as the light-emitting layer 50. The light-emitting layer 50 includes a donor light-emitting layer 510 and an acceptor light-emitting layer 520. The donor light-emitting layer 510 is disposed at a side of the first exciton limiting layer 40 close to the second exciton limiting layer 60. The acceptor light-emitting layer 520 is disposed between the donor light-emitting layer 510 and the second exciton limiting layer 60.

In the present embodiment, the donor light-emitting layer 510 adopts a thermally activated delayed material, the acceptor light-emitting layer 520 adopts no thermally activated delayed material, and the acceptor light-emitting layer adopts a hole blocking material. By making use of a reverse intersystem-crossing (RISC) process of the thermally activated delayed material, making the most of injected carriers and enhancing utilization of excitons, it therefore prevents device aging and deterioration caused by excessive single-type carriers and excessive concentration of the excitons.

The light-emitting layer 50 having the thermally activated delayed material may be self-luminous, and may serve as a host material doped with a guest material that emits light.

A thickness of the donor light-emitting layer 510 ranges from 10 to 30 nm, a thickness of the acceptor light-emitting layer 520 ranges from 10 to 20 nm, and the thickness of the donor light-emitting layer 510 is greater than or equal to the thickness of the acceptor light-emitting layer 520. Arranging the thickness of the donor light-emitting layer 510 to be greater than or equal to the thickness of the acceptor light-emitting layer 520 can enlarge an exciton recombination area and maintain a balance between electrons and holes in the device.

In other embodiments, the donor light-emitting layer 510 and the acceptor light-emitting layer 520 may also be doped with a fluorescent material, and the fluorescent material may range from 1% to 10%.

The light-emitting layer 50 includes a red light-emitting unit 110, a green light-emitting unit 120 and a blue light-emitting unit 130. A triplet excitation energy level of both the first exciton limiting layer 40 and the second exciton limiting layer 60 on the red light-emitting unit 110 is greater than or equal to 2.45 eV. A triplet excitation energy level of both the first exciton limiting layer 40 and the second exciton limiting layer 60 on the green light-emitting unit 120 is greater than or equal to 2.60 eV. A triplet excitation energy level of both the first exciton limiting layer 40 and the second exciton limiting layer 60 on the blue light-emitting unit 130 is greater than or equal to 2.80 eV. In this way, reverse energy transferring can be avoided.

Disposing the exciton limiting layers at both sides of the light-emitting layer 50 can prevent the energy from diffusing from the light-emitting layer to adjacent layers to cause energy loss, thereby ensuring full utilization of the energy.

A thickness of the electron blocking layer 30 on the red light-emitting unit 110 is greater than a thickness of the electron blocking layer 30 on the green light-emitting unit 120, and a thickness of the electron blocking layer 30 on the green light-emitting unit 120 is greater than a thickness of the electron blocking layer 30 on the blue light-emitting unit 130.

The present embodiment further provides a display device, which includes the organic light-emitting device 100 involved in the present invention.

Embodiment 2

An organic light-emitting device provided in the present embodiment is also provided with the donor light-emitting layer 510 and the acceptor light-emitting layer 520, which are substantially as the same as corresponding structures in Embodiment 1. The same structures in the present embodiment may refer to corresponding descriptions in Embodiment 1 and may not be repeated herein. The primary differences between the two embodiments are that no electron blocking layer is disposed in the organic light-emitting device 100, the acceptor light-emitting layer 520 adopts the thermally activated delayed material, the donor light-emitting layer 510 adopts no thermally activated delayed material, the donor light-emitting layer 510 adopts an electron blocking material, the organic light-emitting device 100 further includes a hole blocking layer 70, and the hole blocking layer 70 is disposed between the electron transmission layer 80 and the second exciton limiting layer 60.

Figure 2:
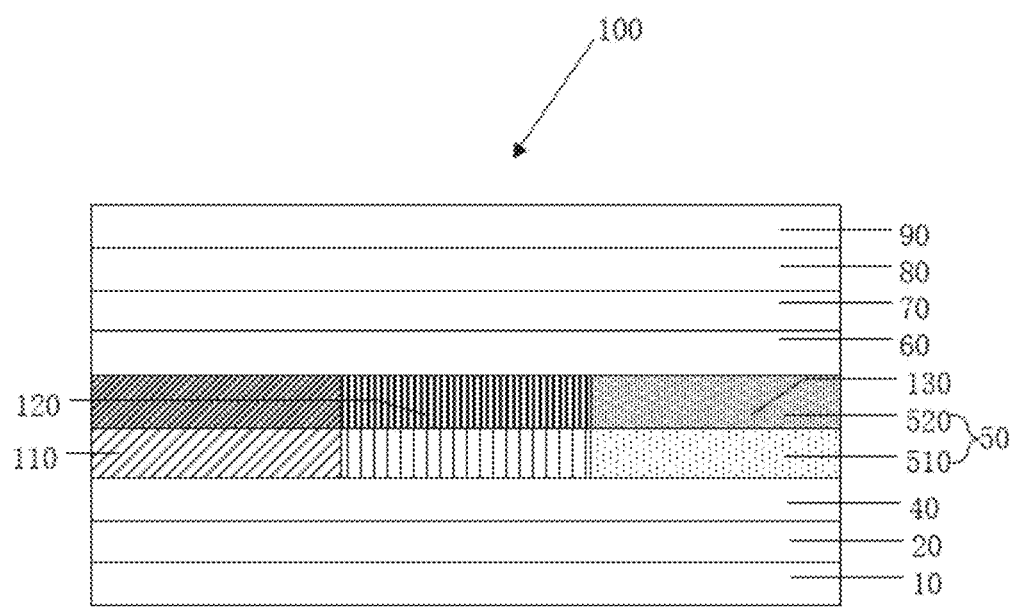
FIG. 2 is a structural schematic diagram showing an organic light-emitting device provided in Embodiment 2 of the present invention.

Please refer to FIG. 2, which is a structural schematic diagram illustrating an organic light-emitting device 100 provided in the present embodiment of the present application.

Embodiment 3

In the organic light-emitting film layers of the present embodiment, it also provides the donor light-emitting layer 510 and the acceptor light-emitting layer 520, which are substantially as the same as corresponding structures in Embodiment 1. The same structures in the present embodiment may refer to corresponding descriptions in Embodiment 1 and may not be repeated herein. The primary differences between the two embodiments are that both the acceptor light-emitting layer 520 and the donor light-emitting layer 510 adopt the thermally activated delayed material, the organic light-emitting device 100 further includes a hole blocking layer 70, and the hole blocking layer 70 is disposed between the electron transmission layer 80 and the second exciton limiting layer 60.

Figure 3:
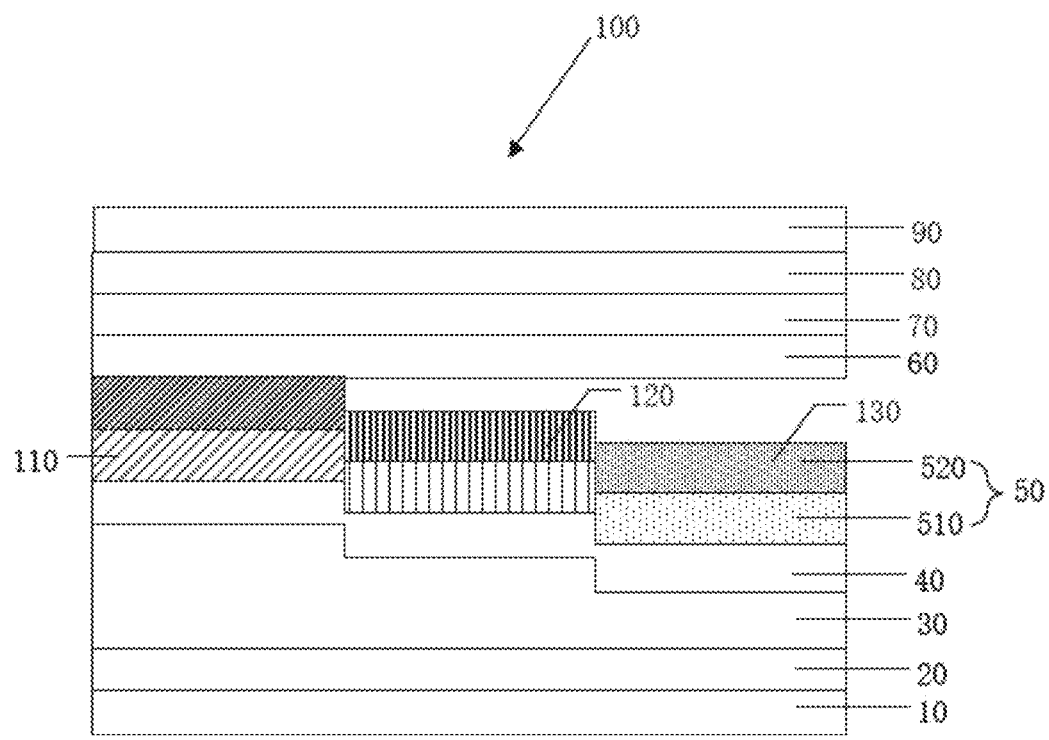
FIG. 3 is a structural schematic diagram showing an organic light-emitting device provided in Embodiment 3 of the present invention.

Please refer to FIG. 3, which is a structural schematic diagram illustrating an organic light-emitting device 100 provided in the present embodiment of the present application.

Meanwhile, a ratio of the thermally activated delayed material adopted by the donor light-emitting layer 510 to the thermally activated delayed material adopted by the acceptor light-emitting layer 520 ranges from 1.3:1 to 1:1.3.

The beneficial effects of the present invention are described as follows. The present invention provides an organic light-emitting device and a display device, in which a donor-acceptor (D-A) structure material is chosen as the light-emitting layer, which is arranged to include the donor light-emitting layer and the acceptor light-emitting layer, at least one film layer of which adopts the thermally activated delayed material. By making use of a reverse intersystem-crossing (RISC) process of the thermally activated delayed material, making the most of injected carriers and enhancing utilization of excitons, it therefore prevents device aging and deterioration caused by excessive single-type carriers and excessive concentration of the excitons.

Further, disposing the exciton limiting layers at both sides of the light-emitting layer can prevent the energy from diffusing from the light-emitting layer to adjacent layers to cause energy loss, thereby ensuring full utilization of the energy.

In the above embodiments, different emphasis is placed on respective embodiments, and reference may be made to related depictions in other embodiments for portions not detailed in a certain embodiment.

Hereinbefore, the organic light-emitting device and the display apparatus provided in the embodiments of the present application are introduced in detail, the principles and implementations of the present application are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:

1. An organic light-emitting device, comprising a light-emitting layer, which comprises:
    a donor light-emitting layer and an acceptor light-emitting layer, wherein at least one film layer of the donor light-emitting layer and the acceptor light-emitting layer adopts a thermally activated delayed material;
    a first exciton limiting layer, disposed at a side of the donor light-emitting layer away from the acceptor light-emitting layer; and
    a second exciton limiting layer, disposed at a side of the acceptor light-emitting layer away from the donor light-emitting layer.

2. The organic light-emitting device according to claim 1, wherein a thickness of the donor light-emitting layer ranges from 10 to 30 nm, a thickness of the acceptor light-emitting layer ranges from 10 to 20 nm, and the thickness of the donor light-emitting layer is greater than or equal to the thickness of the acceptor light-emitting layer.

3. The organic light-emitting device according to claim 1, wherein in a case that both the donor light-emitting layer and the acceptor light-emitting layer adopt the thermally activated delayed material, a ratio of the thermally activated delayed material adopted by the donor light-emitting layer to the thermally activated delayed material adopted by the acceptor light-emitting layer ranges from 1.3:1 to 1:1.3.

4. The organic light-emitting device according to claim 1, wherein the light-emitting layer comprises a red light-emitting unit, a green light-emitting unit and a blue light-emitting unit, a triplet excitation energy level of both the first exciton limiting layer and the second exciton limiting layer on the red light-emitting unit is greater than or equal to 2.45 eV, a triplet excitation energy level of both the first exciton limiting layer and the second exciton limiting layer on the green light-emitting unit is greater than or equal to 2.60 eV, and a triplet excitation energy level of both the first exciton limiting layer and the second exciton limiting layer on the blue light-emitting unit is greater than or equal to 2.80 eV.

5. The organic light-emitting device according to claim 1, further comprising:
    a hole transmission layer, disposed at a side of the first exciton limiting layer away from the light-emitting layer;
    a hole injection layer, disposed at a side of the hole transmission layer away from the light-emitting layer;
    an electron transmission layer, disposed at a side of the second exciton limiting layer away from the light-emitting layer; and
    an electron injection layer, disposed at a side of the electron transmission layer away from the light-emitting layer.

6. The organic light-emitting device according to claim 5, wherein in a case that the donor light-emitting layer adopts the thermally activated delayed material and the acceptor light-emitting layer adopts no thermally activated delayed material, the acceptor light-emitting layer adopts a hole blocking material, the organic light-emitting device further comprises an electron blocking layer, and the electron blocking layer is disposed between the hole transmission layer and the first exciton limiting layer.

7. The organic light-emitting device according to claim 5, wherein in a case that the acceptor light-emitting layer adopts the thermally activated delayed material and the donor light-emitting layer adopts no thermally activated delayed material, the donor light-emitting layer adopts an electron blocking material, the organic light-emitting device further comprises a hole blocking layer, and the hole blocking layer is disposed between the electron transmission layer and the second exciton limiting layer.

8. The organic light-emitting device according to claim 5, wherein in a case that both the acceptor light-emitting layer and the donor light-emitting layer adopt the thermally activated delayed material, the organic light-emitting device further comprises:
    an electron blocking layer, disposed between the hole transmission layer and the first exciton limiting layer; and
    a hole blocking layer, disposed between the electron transmission layer and the second exciton limiting layer.

9. A display apparatus, comprising the organic light-emitting device according to claim 1.

10. The display apparatus according to claim 9, wherein a thickness of the donor light-emitting layer ranges from 10 to 30 nm, a thickness of the acceptor light-emitting layer ranges from 10 to 20 nm, and the thickness of the donor light-emitting layer is greater than or equal to the thickness of the acceptor light-emitting layer.

11. The display apparatus according to claim 9, wherein in a case that both the donor light-emitting layer and the acceptor light-emitting layer adopt the thermally activated delayed material, a ratio of the thermally activated delayed material adopted by the donor light-emitting layer to the thermally activated delayed material adopted by the acceptor light-emitting layer ranges from 1.3:1 to 1:1.3.

12. The display apparatus according to claim 9, wherein the light-emitting layer comprises a red light-emitting unit, a green light-emitting unit and a blue light-emitting unit, a triplet excitation energy level of both the first exciton limiting layer and the second exciton limiting layer on the red light-emitting unit is greater than or equal to 2.45 eV, a triplet excitation energy level of both the first exciton limiting layer and the second exciton limiting layer on the green light-emitting unit is greater than or equal to 2.60 eV, and a triplet excitation energy level of both the first exciton limiting layer and the second exciton limiting layer on the blue light-emitting unit is greater than or equal to 2.80 eV.

13. The display apparatus according to claim 9, further comprising:
    a hole transmission layer, disposed at a side of the first exciton limiting layer away from the light-emitting layer;
    a hole injection layer, disposed at a side of the hole transmission layer away from the light-emitting layer;

an electron transmission layer, disposed at a side of the second exciton limiting layer away from the light-emitting layer; and an electron injection layer, disposed at a side of the electron transmission layer away from the light-emitting layer.

14. The display apparatus according to claim 13, wherein in a case that the donor light-emitting layer adopts the thermally activated delayed material and the acceptor light-emitting layer adopts no thermally activated delayed material, the acceptor light-emitting layer adopts a hole blocking material, the organic light-emitting device further comprises an electron blocking layer, and the electron blocking layer is disposed between the hole transmission layer and the first exciton limiting layer.

15. The display apparatus according to claim 13, wherein in a case that the acceptor light-emitting layer adopts the thermally activated delayed material and the donor light-emitting layer adopts no thermally activated delayed material, the donor light-emitting layer adopts an electron blocking material, the organic light-emitting device further comprises a hole blocking layer, and the hole blocking layer is disposed between the electron transmission layer and the second exciton limiting layer.

16. The display apparatus according to claim 13, wherein in a case that both the acceptor light-emitting layer and the donor light-emitting layer adopt the thermally activated delayed material, the organic light-emitting device further comprises:

an electron blocking layer, disposed between the hole transmission layer and the first exciton limiting layer; and a hole blocking layer, disposed between the electron transmission layer and the second exciton limiting layer.

* * * * *